(12) United States Patent
Fujimura et al.

(10) Patent No.: US 10,716,222 B2
(45) Date of Patent: Jul. 14, 2020

(54) LAMINATE PRODUCTION METHOD

(71) Applicant: ZEON CORPORATION, Tokyo (JP)

(72) Inventors: Makoto Fujimura, Tokyo (JP); Youhei Tateishi, Tokyo (JP)

(73) Assignee: INTEL CORPORATION, Santa Clara, CA (US)

(*) Notice: Subject to any disclaimer, the term of this patent is extended or adjusted under 35 U.S.C. 154(b) by 509 days.

(21) Appl. No.: 15/513,527

(22) PCT Filed: Sep. 29, 2015

(86) PCT No.: PCT/IB2015/002078
§ 371 (c)(1),
(2) Date: Aug. 28, 2017

(87) PCT Pub. No.: WO2016/051269
PCT Pub. Date: Apr. 7, 2016

(65) Prior Publication Data
US 2017/0359907 A1  Dec. 14, 2017

(30) Foreign Application Priority Data
Sep. 29, 2014 (JP) .................. 2014-198094

(51) Int. Cl.
H05K 3/42 (2006.01)
H05K 3/00 (2006.01)
H05K 3/46 (2006.01)

(52) U.S. Cl.
CPC ............ H05K 3/429 (2013.01); H05K 3/005 (2013.01); H05K 3/007 (2013.01); H05K 3/0014 (2013.01);
(Continued)

(58) Field of Classification Search
CPC ..... H05K 2203/072; H05K 2203/0723; H05K 2203/1105; H05K 3/0014; H05K 3/0032; H05K 3/005; H05K 3/0055
See application file for complete search history.

(56) References Cited

U.S. PATENT DOCUMENTS 5,670,250 A * 9/1997 Sanville, Jr. .......... B29C 70/025
                                                    174/256
6,700,078 B2 * 3/2004 Farquhar ................ H05K 3/429
                                                    174/255
(Continued)

FOREIGN PATENT DOCUMENTS

CN   1396800 A    2/2003
JP   59-051594 A  3/1984
(Continued)

OTHER PUBLICATIONS

PCT International Search Report for PCT Counterpart Application No. PCT/IB2015/002078 with English translation, 4pgs. (dated Apr. 19, 2016).
PCT Written Opinion of the International Searching Authority for PCT Counterpart Application No. PCT/IB2015/002078, 4 pgs. (dated Apr. 19, 2016).
(Continued)

Primary Examiner — Minh N Trinh
(74) Attorney, Agent, or Firm — Womble Bond Dickinson (US) LLP

(57) ABSTRACT

Method of manufacturing laminate body by: curing thermosetting resin composition on a support; laminating the curable resin onto a substrate; heating the laminate; forming a via hole in the cured resin layer; peeling the supporting body from the cured composite; performing a second heating of the cured composite; removing resin residue in the via hole of the cured composite; and forming a conductor layer on an inner wall surface of the via hole.

14 Claims, 1 Drawing Sheet

(52) U.S. Cl.
CPC .......... *H05K 3/0055* (2013.01); *H05K 3/422* (2013.01); *H05K 3/423* (2013.01); *H05K 3/4644* (2013.01); *H05K 3/0032* (2013.01); *H05K 3/427* (2013.01); *H05K 2203/072* (2013.01); *H05K 2203/0723* (2013.01); *H05K 2203/1105* (2013.01)

(56) References Cited

U.S. PATENT DOCUMENTS

| | | | | |
|---|---|---|---|---|
| 8,721,959 | B2* | 5/2014 | Dry | B29C 73/22 |
| | | | | 264/232 |
| 2011/0224332 | A1* | 9/2011 | He | C08G 59/42 |
| | | | | 523/456 |
| 2017/0359907 | A1* | 12/2017 | Fujimura | H05K 3/0014 |

FOREIGN PATENT DOCUMENTS

| | | |
|---|---|---|
| JP | 06-260759 A | 9/1994 |
| JP | 2014-007403 A | 1/2014 |
| JP | 2016-72333 A | 5/2016 |
| KR | 10-2013-0135106 A | 12/2013 |
| TW | 201414390 A | 4/2014 |
| TW | 201436688 A | 9/2014 |

OTHER PUBLICATIONS

International Preliminary Report on Patentability received for PCT Patent Application No. PCT/IB2015/002078, dated Apr. 13, 2017, 13 pages (7 pages of English Translation and 6 pages of Original Document).

\* cited by examiner

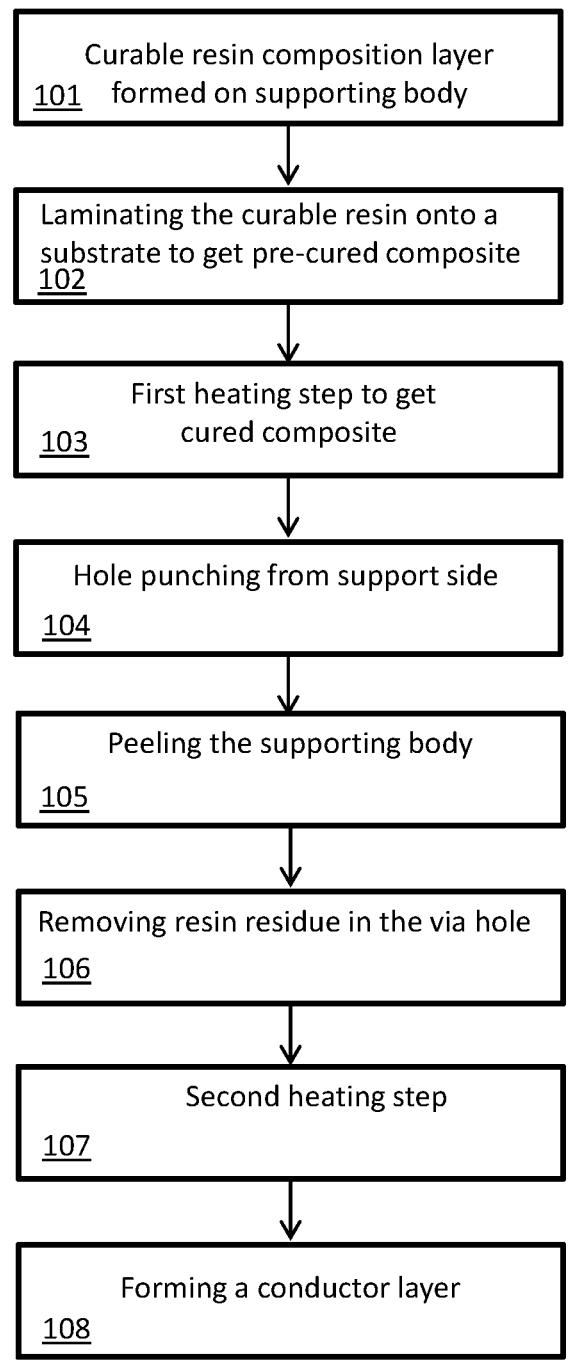

LAMINATE PRODUCTION METHOD

FIELD

The present invention relates to a method of manufacturing a laminate body wherein a conductor layer and a cured resin layer are provided on a substrate.

BACKGROUND

Along with pursuing downsizing, multifunctionalization, increasing communication speeds, and the like of electronic equipment, further densification of the circuit board used in electronic equipment is required, and multilayering of circuit boards is being achieved to meet the requirements of densification. The multilayer circuit board is formed, for example, on an inner layer substrate made of an electrical insulating layer and a conductor layer formed on a surface of the electrical insulating layer, by laminating an electrical insulating layer and forming a conductor layer on the electrical insulating layer, and further repeating laminating the electrical insulating layers and forming the conductor layers.

As a method of manufacturing the laminate body for forming the multilayer circuit board, for example, Patent Document 1 discloses a manufacturing method of a multilayer printed wiring board that requires a step of heating and applying pressure to perform laminating under vacuum conditions, in a condition of directly covering a resin composition layer of an adhesive film onto at least a pattern processed portion of one surface or both surfaces on a supporting base film having a release layer and a circuit board that was pattern processed thereof, a step of thermally curing the resin composition in a condition attached to the supporting base film, a step of hole punching by a laser or drill, a step of peeling the supporting base film, a step of performing roughening treatment to a resin composition surface, and then a step of plating the roughened surface to form the conductor film.

In the Patent Literature 1, the resin composition is thermally cured in a condition attached to a supporting body such as a supporting base film, and thereby, foreign matter that attaches during thermal curing of the resin composition and defects such as disconnecting, shorting, and the like caused by the foreign matter are prevented. Furthermore, in Patent Literature 1, after the resin composition in the condition attached with the supporting body is thermally cured, and before the supporting body is peeled, a small diameter via hole can be formed by performing hole punching by a laser or drill.

CITATION LIST

Patent Literature

Patent Literature 1: Japanese Unexamined Patent Application Publication No. 2001-196743

SUMMARY

However, with the technique in Patent Document 1, when thermal curing is performed on the resin composition in a condition attached to a supporting body such as a supporting base film, heating is insufficient in the case of peeling the supporting body after thermal curing, and the cured resin after thermal curing may have inferior heat resistance. On the other hand, when thermal curing is performed on the resin composition in a condition attached to the supporting body, if curing conditions are relatively severe (such as increased curing temperature or increased curing time), removing resin residue in the via hole is difficult, and there is a problem where the via hole has inferior conduction reliability.

The object of the present invention is to provide a method for manufacturing a laminate body with excellent heat resistance (solder heat resistance, for example) and excellent conduction reliability, in which a small diameter via hole can be formed.

As a result of extensive studies, the inventors discovered that with the method of manufacturing the laminate body provided with the conductor layer and the cured resin layer on the substrate, after the curable resin composition layer in a condition attached to the supporting body is heated and thereby cured, and after the via hole is formed by performing hole punching of the cured resin layer from the supporting body side after curing, and after peeling the supporting body, and removing the resin residue in the via hole that was formed, and thereafter adopting a step of performing heating again, the problem of heat resistance when the curable resin composition layer in a condition attached to the supporting body is thermally cured, and the problem of conduction reliability of the via hole caused by the remaining resin residue in the via hole, can be effectively resolved, and therefore the present invention was achieved.

In other words, the present invention provides:

[1] a manufacturing method of a laminate body, containing: a first step of forming onto a supporting body a curable resin composition layer formed from a thermosetting resin composition to obtain a curable resin composition layer with a supporting body; a second step of laminating the aforementioned curable resin composition layer with a supporting body onto a substrate on a curable resin composition layer forming surface side to obtain a pre-cured composite with a supporting body formed from a substrate and a curable resin composition layer with a supporting body; a third step of performing a first heating of the aforementioned composite and thermally curing the aforementioned curable resin composition layer to form a cured resin layer to obtain a cured composite with a supporting body formed from a substrate and a cured resin layer with a supporting body; a fourth step of performing hole punching from the aforementioned supporting body side of the aforementioned cured composite with a supporting body to form a via hole in the aforementioned cured resin layer; a fifth step of peeling the aforementioned supporting body from the aforementioned cured composite with a supporting body to obtain a cured composite formed from a substrate and a cured resin layer; a sixth step of removing resin residue in the via hole of the aforementioned cured composite; a seventh step of performing a second heating of the aforementioned cured composite; and an eighth step of forming a conductor layer on an inner wall surface of the via hole of the aforementioned cured composite and on the aforementioned cured resin layer,

[2] the manufacturing method of a laminate body according to [1], wherein the heating temperature of the aforementioned second heating in the aforementioned step 7 is lower than the heating temperature of the aforementioned first heating in the aforementioned step 3,

[3] the manufacturing method of a laminate body according to [1] or [2], wherein forming the aforementioned conductor layer in the aforementioned step 8 is performed by electroless plating or a combination of electroless plating and electrolytic plating,

[4] the manufacturing method of a laminate body according to any one of [1] to [3], wherein forming the conductor layer with regard to the aforementioned via hole in the aforementioned step 8 is performed by filling a conductor into the aforementioned via hole by electroless plating or a combination of electroless plating and electrolytic plating,

[5] a laminate body obtained by the manufacturing method according to any one of [1] to [4], and

[6] a multilayer circuit board comprising the laminate body according to [5].

The manufacturing method of the present invention can provide a laminate body with excellent heat resistance (solder heat resistance, for example) and excellent conduction reliability, in which a small diameter via hole can be formed, and a multilayer circuit board obtained by using the laminate body.

BRIEF DESCRIPTION OF THE DRAWING

FIG. 1 illustrates a fabrication method according to one embodiment.

DETAILED DESCRIPTION

The manufacturing method of a laminate body of the present invention is illustrated in FIG. 1 showing a method of manufacturing the laminate body wherein a conductor layer and a cured resin layer are provided on a substrate, and provides:

(101) a manufacturing method of a laminate body, containing: a first step of forming onto a supporting body a curable resin composition layer formed from a thermosetting resin composition to obtain a curable resin composition layer with a supporting body;

(102) a second step of laminating the aforementioned curable resin composition layer with a supporting body onto a substrate on a curable resin composition layer forming surface side to obtain a pre-cured composite with a supporting body formed from a substrate and a curable resin composition layer with a supporting body;

(103) a third step of performing a first heating of the aforementioned composite and thermally curing the aforementioned curable resin composition layer to form a cured resin layer to obtain a cured composite with a supporting body formed from a substrate and a cured resin layer with a supporting body;

(104) a fourth step of performing hole punching from the aforementioned supporting body side of the aforementioned cured composite with a supporting body to form a via bole in the aforementioned cured resin layer;

(105) a fifth step of peeling the aforementioned supporting body from the aforementioned cured composite with a supporting body to obtain a cured composite formed from a substrate and a cured resin layer;

(106) a sixth step of removing resin residue in the via hole of the aforementioned cured composite;

(107) a seventh step of performing a second heating of the aforementioned cured composite; and (108) an eighth step of forming a conductor layer on an inner wall surface of the via hole of the aforementioned cured composite and on the aforementioned cured resin layer.

First Step

The first step of the manufacturing method of the present invention is a step of forming onto a supporting body a curable resin composition layer formed from a thermosetting resin composition to obtain a curable resin composition layer with a supporting body.

The supporting body used in the first step of the manufacturing method of the present invention is not particularly limited, but include film members, plate members, or the like, and specific examples include polyethylene terephthalate films, polypropylene films, polyethylene films, polycarbonate films, posiethylene naphthalate films, polyarylate films, nylon films, positetrafluoroethylene films, and other polymer films, plate or film glass substrates, and the like. In order to make peeling from the cured resin layer easier, in the fifth step described later, the supporting body preferably has a release layer formed on a surface thereof by a release treatment, and preferably a polyethylene terephthalate film with a release layer.

The thickness of the supporting body used in the first step of the manufacturing method of the present invention is not particularly limited, but is preferably 5 to 200 μm, more preferably 10 to 15 μm, and even more preferably 20 to 60 μm. The thickness of the supporting body used in the first step of the manufacturing method of the present invention is not particularly limited, but is preferably 5 to 200 μm, more preferably 10 to 15 μm, and even more preferably 20 to 60 μm.

Furthermore, the thermosetting resin composition for forming the curable resin composition layer usually contains a curable resin and a curing agent. The curable resin in not particularly limited so long as the curable resin exhibits thermal curability when combined with the curing agent, and has electrical insulating properties, and examples include epoxy resins, maleimide resins, (meth)acrylic resins, diallyl phthalate resins, triazine resins, alicyclic olefin polymers, aromatic polyether polymers, benzocyclobutene polymers, cyanate ester polymer polyimides, and the like. The resins may be used independently or in a combination of two or more types.

A case of using an epoxy resin as the curable resin is described below as an example.

The epoxy resin is not particularly limited, and for example, a polyvalent epoxy compound (A) with a biphenyl structure and/or a condensed polycyclic structure and the like can be used. The polyvalent epoxy compound (A) with a biphenyl structure and/or condensed polycyclic structure [hereinafter may be abbreviated as polyvalent epoxy compound (A).] is a compound having at least one biphenyl structure or condensed polycyclic structure, and having at least two epoxy groups (oxirane ring) in one molecule.

The biphenyl structure refers to a structure wherein two benzene rings are connected by a single bond. The biphenyl structure in the obtained cured resin usually configures a main chain in the resin, but can be present in a side chain.

Furthermore, the condensed polycyclic structure refers to a structure formed by condensation of two or more monocyclic groups. The ring that configures the condensed polycyclic structure may be alicyclic or aromatic, and may contain a hetero atom. The number of condensed rings is not particularly limited, but is preferably 2 rings or more, and practically, the upper limit is approximately 10 rings from the perspective of increasing heat resistance and mechanical strength of the obtained cured resin layer. Examples of the condensed polycyclic structure include dicyclopentadiene structures, naphthalene structures, fluorene structures, anthracene structures, phenanthrene structures, todiphenylene structures, pyrene structures, ovalene structures, and the like. Similar to the biphenyl structure, the condensed polycyclic structure in the obtained cured resin usually configures a main chain in the resin contained in the cured resin layer, but can be present in a side chain.

The polyvalent epoxy compound (A) used in the present invention has a biphenyl structure, condensed polycyclic structure, or both biphenyl structure and condensed polycyclic structure, but from the perspective of increasing heat resistance and mechanical strength of the obtained cured resin layer, the polyvalent epoxy compound (A) preferably has a biphenyl structure, and more preferably has a biphenyl aralkyl structure.

Furthermore, if a polyvalent epoxy compound (A) with a biphenyl structure (includes polyvalent epoxy compounds having both a biphenyl structure and a condensed polycyclic structure.) and a polyvalent epoxy compound (A) with a condensed polycyclic structure are used in combination, from the perspective of improving heat resistance and electrical properties of the cured resin layer, the compounding ratio thereof is preferably a weight ratio (polyvalent epoxy compound having a biphenyl structure/polyvalent epoxy compound having a condensed polycyclic structure) of usually 3/7 to 7/3.

The polyvalent epoxy compound (A) used in the present invention has at least two epoxy groups in one molecule, and the structure thereof is not limited as long as the compound has a biphenyl structure and/or a condensed polycyclic structure, but from the perspective of the cured resin layer having excellent heat resistance and mechanical strength, the compound is preferably a novolak epoxy compound having a biphenyl structure and/or a condensed polycyclic structure.

Examples of the novolak epoxy compound include phenol novolak epoxy compounds, cresol novolak epoxy compounds, and the like.

In order to achieve good curing reactivity, the polyvalent epoxy compound (A) usually has an epoxy equivalent of 100 to 1500 equivalents, and preferably 150 to 500 equivalents. Note that "epoxy equivalent" in the present specification is the number of grams (g/eq) of the epoxy compound containing 1 gram equivalent of an epoxy group, which can be measured according to a method of JIS K 7236.

The polyvalent epoxy compound (A) used in the present invention can be appropriately manufactured according to a known method, and can also be obtained as a commercially available product.

Examples of the commercially available product of the polyvalent epoxy compound (A) having a biphenyl structure are novolak epoxy compounds having a biphenyl aralkyl structure such as trade name "NC3000-FH, NC3000-H, NC3000, NC3000-L, NC3100" (manufactured by Nippon Kayaku Co., Ltd.); and epoxy compounds having a tetramethylbiphenyl structure.

Examples include trade name "YX-4000" (manufactured by Mitsubishi Chemical Corporation); or the like.

Furthermore, examples of the commercially available product of the polyvalent epoxy compound having a condensed polycyclic structure include novolak epoxy compounds having a dicyclopentadiene structure, such as trade name "Epiclon HP7200L, Epiclon HP7200, Epiclon HP7200H, Epiclon HP7200HH, Epiclon HP7200HHH" ("Epiclon" is a registered trademark, manufactured by DIC Corporation), trade name "Tactix 556, Tactix 756" ("Tactix" is a registered trademark, manufactured by Huntsman Advanced Materials), trade name "XD-1000-1L, XD-1000-2L" (manufactured by Nippon Kayaku Co., Ltd.), and the like.

The polyvalent epoxy compounds (A) can be used independently or in a combination of two or more types.

Furthermore, when using the polyvalent epoxy compound (A) having a biphenyl structure and/or a condensed polycyclic structure, an epoxy compound (B) containing a trivalent or higher polyvalent glycidyl group other than the aforementioned phenol novolak epoxy compound may be used in a combination, and by further using the epoxy compound (B) containing a trivalent or higher polyvalent glycidyl group, heat resistance or electrical properties of the obtained cured resin layer can be further improved.

The epoxy compound (B) containing a trivalent or higher polyvalent glycidyl group other than the phenol novolak epoxy compound is preferably a compound with an epoxy equivalent of 250 or less, and more preferably a compound with 220 or less, from the perspective of heat resistance and electrical properties of the obtained cured resin layer. Specific examples include: polyvalent phenol epoxy compounds having a structure where a hydroxyl group of the trivalent or higher polyvalent phenol is glycidylated, glycidyl amine epoxy compounds where an amino group of a compound containing a divalent or higher polyvalent aminophenyl group is glycidylated, compounds containing a polyvalent glycidyl group where a trivalent or higher compound having the phenol structure or aminophenyl structure in the same molecule is glycidylated, and the like.

The polyvalent phenol epoxy compound having a structure where a hydroxyl group of the trivalent or higher polyvalent phenol is glycidylated is not particularly limited, but is preferably a trivalent or higher polyvalent hydroxyphenylalkane epoxy compound. Here, the trivalent or higher polyvalent hydroxyphenylalkane epoxy compound is a compound having a structure where a hydroxyl group of an aliphatic hydrocarbon substituted with three or more hydroxyphenyl groups.

The epoxy compound (B) containing a trivalent or higher polyvalent glycidyl group used in the present invention can be appropriately manufactured according to a known method, and can also be obtained as a commercially available product.

Examples of the commercially available product of the trishydroxyphenylmethane epoxy compound include trade name "EPPN-503, EPPN-502H, EPPN-501H" (manufactured by Nippon Kayaku Co., Ltd.), trade name "TACTIX-742" (manufactured by The Dow Chemical Company), "JER1032H60" (manufactured by Mitsubishi Chemical Corporation), and the like. Furthermore, examples of the commercially available product of the tetrakis hydroxyphenylethane epoxy compound include trade name "jER1031S" (manufactured by Mitsubishi Chemical Corporation), or the like. Examples of the glycidyl amine epoxy compound include trade name "YH-434, YH-434L" (manufactured by Nippon Steel & Sumikin Chemical Co., Ltd.) as a tetravalent glycidyl amine epoxy compound, trade name "jER604" (manufactured by Mitsubishi Chemical Corporation), and the like. Examples of the compound containing a polyvalent glycidyl group where a trivalent or higher compound having a phenol structure or aminophenyl structure in the same molecule is glycidylated include trade name "jER630" (manufactured by Mitsubishi Chemical Corporation) as a trivalent glycidyl amine epoxy compound, or the like.

In the case where the epoxy compound (B) containing a trivalent or higher polyvalent glycidyl group is used in a combination, the content ratio of the epoxy compound (B) containing a trivalent or higher polyvalent glycidyl group is not particularly limited, but is preferably 0.1 to 40 wt. %, more preferably 1 to 30 wt. %, and particularly preferably 3 to 25 wt. % with regard to a total of 100 wt. % of the epoxy compound that is used. By setting the amount of the epoxy compound (B) containing a trivalent or higher polyvalent glycidyl group in the thermosetting resin composition to the aforementioned range in relation to the aforementioned polyvalent epoxy compound (A), the obtained cured resin layer can have further increased heat resistance, electrical properties, and adhesion to the conductor layer.

Furthermore, in addition to the polyvalent epoxy compound (A) and epoxy compound (B) containing a trivalent or higher polyvalent glycidyl group, the thermosetting resin composition used in the present invention can appropriately contain additional epoxy compounds other than the aforementioned epoxy compounds. Examples of additional epoxy compounds include epoxy compounds containing phosphorus. An example of epoxy compounds containing phosphorus preferably includes epoxy compounds having a phosphaphenanthrene structure, and by further using the epoxy compound having a phosphaphenanthrene structure, the obtained cured resin layer can have further improved heat resistance, electrical properties, and adhesion to the conductor layer.

In the case where other epoxy compounds having a phosphaphenanthrene structure is contained in the thermosetting resin composition used in the present invention, the content ratio of the epoxy compound having a phosphaphenanthrene structure is not particularly limited, but is preferably 20 to 90 wt. %, and more preferably 30 to 70 wt. % with regard to a total of 100 wt. % of the epoxy compound contained in the thermosetting resin composition.

Note that as other epoxy compounds, other than or in addition to the epoxy compounds having a phosphaphenanthrene structure, alicyclic epoxy compounds, cresol novolak epoxy compounds, phenol novolak epoxy compounds, bisphenol A novolak epoxy compounds, trisphenol epoxy compounds, tetrakis (hydroxyphenyl) ethane epoxy compounds, aliphatic chain epoxy compounds, and the like can be used, and can be procured appropriately as commercially available products.

Furthermore, the thermosetting resin composition used in the present invention may contain a phenol resin (C) containing a triazine structure. The phenol resin (C) containing a triazine structure is a condensation polymer of aromatic hydroxy compounds such as phenol, cresol, naphthol, and the like, compounds having a triazine ring such as melamine, benzenguanamine, and the like, and formaldehyde. The phenol resin (C) containing a triazine structure typically has a structure as expressed by the following general formula (1).

[Formula 1]

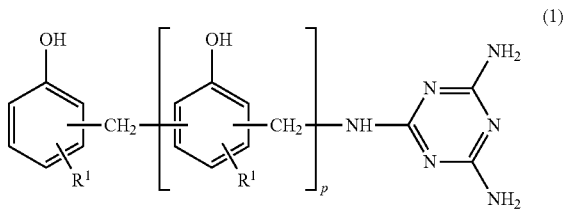

(In formula (1), R1, R2 are a hydrogen atom or a methyl group, and p is an integer of 1 to 30. Furthermore, R1, R2 may be the same or different from each other, and furthermore, when p is 2 or higher, a plurality of R2 may be the same or different from each other. Furthermore, in formula (1), in at least one of the amino groups, a hydrogen atom contained in the amino group can be substituted with another group (an alkyl group or the like, for example).)

The phenol resin (C) containing a triazine structure acts as a curing agent of the epoxy compound by the presence of a phenolic active hydroxy group, and particularly, the obtained cured resin layer exhibits excellent adhesion to the substrate by containing the phenol resin (C) containing a triazine structure.

The phenol resin (C) containing a triazine structure can be manufactured according to a known method, and can also be obtained as a commercially available product. Examples of the commercially available product include trade name "LA7052, LA7054, LA3018, LA1356" (manufactured by DIC Corporation) or the like.

The phenol resin (C) containing a triazine structure can be used independently or in a combination of two or more types.

The added amount of the phenol resin (C) containing a triazine structure in the thermosetting resin composition used in the present invention is in a range of preferably 1 to 60 parts by weight, more preferably 2 to 50 parts by weight, even more preferably 3 to 40 parts by weight, and particularly preferably 4 to 20 parts by weight with regard to a total of 100 parts by weight of the epoxy compound that is used.

Furthermore, the equivalent ratio of the epoxy compound that is used and the phenol resin (C) containing a triazine structure in the thermosetting resin composition used in the present invention (ratio of the total number of active hydroxyl group content in the phenol resin (C) containing a triazine structure, with regard to the total number of epoxy groups of the epoxy compound that is used (active hydroxyl group content/epoxy group content)) is within a range of preferably 0.01 to 0.6, more preferably 0.05 to 0.4, and even more preferably 0.1 to 0.3.

By setting the added amount of the phenol resin (C) containing a triazine structure to the aforementioned range, electrical properties and heat resistance of the obtained cured resin layer can be improved.

Note that the equivalent ratio of the epoxy compound that is used and the phenol resin (C) containing a triazine structure can be determined from the total epoxy equivalent of the epoxy compound that is used, and the total active hydroxyl group equivalent of the phenol resin (C) containing a triazine structure. Furthermore, the thermosetting resin composition used in the present invention preferably contains an active ester compound (D) in addition to the aforementioned components.

The active ester compound (D) preferably has an active ester group, but in the present invention, the active ester compound (D) is preferably a compound having at least two active ester groups in a molecule. The active ester compound (D) acts as a curing agent of the epoxy compound used in the present invention, similarly to the phenol resin (C) containing a triazine structure, by an epoxy site and an epoxy group reacting by heating.

From the perspective of increasing the heat resistance of the obtained cured resin layer, the active ester compound (D), is preferably an active ester compound obtained by reacting a carboxylic acid compound and/or thiocarboxylic acid compound with a hydroxy compound and/or thiol compound, more preferably an active ester compound obtained by reacting one or two types or more selected from a group of carboxylic acid compounds, phenol compounds, naphthol compounds, and thiol compounds, and particularly preferably an aromatic compound obtained by reacting a carboxylic acid compound with an aromatic compound having a phenolic hydroxyl group, and having at least two active ester groups in a molecule.

The active ester compound (D) may have a straight chain or multi-branched shape, and in the case where the active ester compound (D) is derived from a compound having at least two carboxylic acids in a molecule, as an example, if the compound having at least two carboxylic acids in a molecule contains an aliphatic chain, compatibility with an epoxy compound can be increased, and if the compound contains an aromatic ring, the heat resistance will be increased. Specific examples of the carboxylic acid compound for forming the active ester compound (D) include benzoic acids, acetic acids, succinic acids, maleic acids, itaconic acids, phthalic acids, isophthalic acids, terephthalic acids, pyromellitic acids, and the like. Of these, from the perspective of increasing the heat resistance of the obtained cured resin layer, the carboxylic acid compound is preferably a succinic acid, maleic acid, itaconic acid, phthalic acid, isophthalic acid, or terephthalic acid, more preferably a phthalic acid, isophthalic acid, and diphthalic acid, and even more preferably an isophthalic acid, and terephthalic acid. Specific examples of the thiocarboxylic acid compound for forming the active ester compound (D) include thioacetic acids, thiobenzoic acids, and the like.

Specific examples of the hydroxy compound for forming the active ester compound (D) include hydroquinone, resorcin, bisphenol A, bisphenol F, bisphenol S, phenophtharin, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzene triol, dicyclopentadienyl diphenol, phenol novolak, and the like.

Of these, from the perspective of improving solubility of the active ester compound (D) as well as increasing the heat resistance of the obtained cured resin layer, the hydroxy compound is preferably 1,5-dihydroxynaphthalene, 1,6-dihydroxynaphthalene, 2,6-dihydroxynaphthalene, dihydroxybenzophenone, trihydroxybenzophenone, tetrahydroxybenzophenone, dicyclopentadienyl diphenol, and phenol novolak, more preferably dihydroxybenzophenone, trihydroxybenzophenone, tetrahydro, roxybensophenone, dicyclopentadienyl diphenol, and phenol novolak, and even more preferably dicyclopentadienyl diphenol, and phenol novolak.

Specific examples of the thiol compound for forming the active ester compound (D) include benzenedithiol, todiazindithiol, and the like.

The manufacturing method of the active ester compound (D) is not particularly limited, and the compound can be manufactured by a known method.

For example, the compound can be obtained by condensation reaction of the aforementioned carboxylic acid compound and/or thiocarboxylic acid compound with a hydroxy compound and/or thiol compound.

For example, an aromatic compound having an active ester group disclosed in Japanese Unexamined Patent Application 2002-12650, a polyfunctional polyester disclosed in Japanese Unexamined Patent Application 2004-277460, and commercially available products can be used as the active ester compound (D). Examples of the commercially available products include trade name "EXB 9451, EXB 9460, EXB 94605, Epiclon HPC-8000-65T" ("Epiclon" is a registered trademark, manufactured by DIC Corporation), trade name "DC 808" (manufactured by Japan Epoxy Resins Co., Ltd.), and the like. The added amount of the active ester compound (D) in the thermosetting resin composition used in the present invention is in a range of preferably 10 to 150 parts by weight, more preferably 15 to 130 parts by weight, and even more preferably 20 to 120 parts by weight with regard to a total of 100 parts by weight of the epoxy compound that is used.

Furthermore, the equivalent ratio of the epoxy compound that is used and the active ester compound (D) in the thermosetting resin composition used in the present invention (ratio of the total number of reactive groups of the active ester compounds (D), with regard to the total number of epoxy groups of the epoxy compound that is used (active ester group content/epoxy group content)) is within a range of preferably 0.5 to 1.2, more preferably 0.6 to 0.9, and even more preferably 0.65 to 0.85.

Furthermore, the equivalent ratio of the epoxy compound that is used, the phenol resin (C) containing a triazine structure, and the active ester compound (D) in the thermosetting resin composition used in the present invention (ratio of the total number of epoxy groups in the epoxy compound that is used, with regard to the active hydroxyl group of the phenol resin (C) containing a triazine structure and the active ester group of the active ester compound (D) (epoxy group content/(active hydroxyl group content+active ester group content)) is within a range of usually less than 1.2, preferably 0.6 to 0.99, and more preferably 0.65 to 0.95. By setting the equivalent ratio to the aforementioned range, the obtained cured resin layer can exhibit good electric properties. Note that the equivalent ratio of the epoxy compound that is used, and the phenol resin (C) containing a triazine structure and the active ester compound (D) can be determined from the total epoxy equivalent of the epoxy compound that is used, and the total active hydroxyl group equivalent of the phenol resin (C) containing a triazine structure and the total active ester equivalent of the active ester compound (D).

In addition to the aforementioned components, the thermosetting resin composition used in the present invention can further contain other components as described below. The obtained cured resin layer can have low expansion properties by adding a filler to the thermosetting resin composition. A known inorganic filler or organic filler can be used as the filler, but an inorganic filler is preferable. Specific examples of the inorganic filler include calcium carbonate, magnesium carbonate, barium carbonate, zinc oxide, titanium oxide, titania oxide, magnesium silicate, calcium silicate, zirconium silicate, hydrated aluminas, magnesium hydroxide, aluminum hydroxide, barium sulfate, silica, talc, clay, and the like. Note that the filler that is used can be previously surface treated with a silane coupling agent or the like.

The amount of filler in the thermosetting resin composition used in the present invention is not particularly limited, but is usually 30 to 90 wt. % in terms of solid content. Furthermore, an alicyclic olefin polymer having a polar group can be added to the thermosetting resin composition.

Examples of the polar group include groups having a structure that can react with an epoxy group and form a covalent bond, and groups containing a hetero atom and having no reactivity with epoxy groups, but preferably the groups contain a hetero atom and have no reactivity with epoxy groups.

The alicyclic olefin polymer has no reactivity with epoxy groups, and therefore, does not substantially contain a functional group having reactivity with epoxy groups. Herein, "does not substantially contain a functional group having reactivity with epoxy groups" means that the alicyclic olefin polymer does not contain a functional group having reactivity with epoxy groups to a degree of inhibiting the expression of the effect of the present invention. An example of the functional group having reactivity with epoxy groups include groups having a structure that can react with an epoxy group and form a covalent bond, and examples thereof include primary amino groups, secondary amino groups, mercapto groups, carboxyl groups, carboxylic acid anhydride groups, hydroxy groups, epoxy groups, and other functional groups containing a hetero atom that reacts with an epoxy group and forms a covalent bond.

The aforementioned alicyclic olefin polymer can be easily obtained by appropriately combining, for example, an alicyclic olefin monomer (a) containing no hetero atoms and containing an aromatic ring, alicyclic olefin monomer (b) containing no aromatic rings and containing a hetero atom, alicyclic olefin monomer (c) containing both an aromatic ring and a hetero atom, and a monomer (d) containing neither aromatic rings nor hetero atoms, and that can polymerize the alicyclic olefin monomers (a) to (c), and polymerizing according to a known method. The obtained polymer may be further hydrogenated.

The added amount of the alicyclic olefin polymer having a polar group in the thermosetting resin composition used in the present invention is not particularly limited, but is usually 50 parts by weight or lower, and preferably 35 parts by weight or lower, with regard to a total of 100 parts by weight of the epoxy compound that is used. The thermosetting resin composition may optionally contain a curing promoting agent.

The curing promoting agent is not particularly limited, but examples thereof include aliphatic polyamines, aromatic polyamines, secondary amines, tertiary amines, acid anhydrides, imidazole derivatives, organic acid hydrazides, dicyandiamides, derivatives thereof, urea derivatives, and the like.

Of these, imidazole derivatives are particularly preferable. The imidazole derivative is not particularly limited as long as it is a compound having an imidazole skeleton, and examples include 2-ethylimidazole, 2-ethyl-4-methylimidazole, bis-2-ethyl-4-methylimidazole, 1-methyl-2-ethylimidazole, 2-isopropylimidazole, 2,4-dimethylimidazole, 2-heptadecylimidazole, and other alkyl-substituted imidazole compounds; 2-phenylimidazole, 2-phenyl-4-methylimidazole, 1-benzyl-2-methylimidazole, 1-benzyl-2-ethylimidazole, 1-benzyl-2-phenylimidazole, benzimidazole, 2-ethyl-(2'-cyanoethyl) imidazole, and other imidazole compounds substituted with a hydrocarbon group containing a cyclic structure such as an aryl group and an aralkyl group.

These may be used independently as one type or may be used in a combination of two or more types.

The added amount of the curing promoting agent in the thermosetting resin composition used in the present invention is usually 0.1 to 10 parts by weight and preferably 0.5 to 8 parts by weight with regard to a total of 100 parts by weight of the epoxy compound that is used.

Furthermore, for the purpose of improving flame retardancy of the obtained cured resin layer, a flame retardant that is added to a general resin composition for forming an electrical insulating film such as halogen type flame retardants or phosphate ester type flame retardants, for example, may be appropriately added to the thermosetting resin composition.

Furthermore, if desired, flame retardant auxiliary agents, heat resistant stabilizers, weather resistant stabilizers, antioxidants, ultraviolet absorbers (laser processability improver), leveling agents, antistatic agents, slip agents, anti-blocking agents, anti-fogging agents, lubricants, dyes, natural oils, synthetic oils, waxes, emulsions, magnetic materials, dielectric property adjusting agents, toughening agents, and other known components may be appropriately added to the thermosetting resin composition of the present invention.

The method of preparing the thermosetting resin composition used in the present invention is not particularly limited, and the aforementioned components may be mixed as they are, may be mixed as a state dissolved or dispersed in an organic solvent, or a composition in a state wherein a portion of the components are dissolved or dispersed in an organic solvent may be prepared, and then the remaining components may be mixed into the composition. In the first step of the manufacturing method of the present invention, the thermosetting resin composition described above can be used to form onto the supporting body the curable resin composition layer made of the thermosetting resin composition to obtain the curable resin composition layer with a supporting body.

The method for forming onto the supporting body the curable resin composition layer made from the thermosetting resin composition is not particularly limited, but a method of adding an organic solvent to the thermosetting resin composition as desired, and then coating, spraying, or casting the composition onto the supporting body, and then drying, is preferable. The thickness of the curable resin composition layer is not particularly limited, but from the perspective of workability or the like, the thickness is usually 5 to 50 μm, preferably 7 to 40 μm, more preferably 10 to 35 μm, and even more preferably 10 to 30 μm. Examples of the method of coating the thermosetting resin composition include dip coating, roll coating, curtain coating, die coating, slit coating, gravure coating, and the like. Note that in addition to a case where the thermosetting resin composition is uncured, the curable resin composition layer may be in a semi-cured state.

Herein, "uncured" refers to a state where the entire curable resin substantially dissolves when the curable resin composition is immersed into a solvent that can dissolve the curable resin (epoxy resin, for example) that is used for preparing the thermosetting resin composition. Furthermore, semi-cured refers to a state where the composition is partially cured where further curing can be performed if further heating is performed, and preferably a state where a portion (specifically an amount of 7 wt. % or higher with a portion remaining) of the curable resin dissolves in a solvent that can dissolve the curable resin used for preparing the thermosetting resin composition, or a state where the volume after immersing the compact into the solvent for 24 hours is 200% or higher than the volume before immersing (swelling ratio). Furthermore, after the thermosetting resin composition is coated onto the supporting body, drying may be performed if desired. The drying temperature is preferably a temperature at which the thermosetting resin composition is not cured, and may be set according to the type of curable resin that is used, but is usually 20 to 300° C., and preferably 30 to 200° C. If the drying temperature is too high, the curing reaction advances excessively and there is a risk where the obtained curable resin composition layer may not be in an uncured or semi-cured state.

[Cropped sentence] Furthermore, when drying. Furthermore, in the first step of the manufacturing method of the present invention, the curable resin composition layer can have a structure of two layers or more.

For example, before forming the resin layer (hereinafter, the resin layer is referred to as "the first resin layer") formed by using the aforementioned thermosetting resin composition (hereinafter, the thermosetting resin composition is referred to as "the first thermosetting resin composition"), a second thermosetting resin composition which is different from the first thermosetting resin composition is used to form on the supporting body a second resin layer which is different from the first resin layer, and by forming on this the first resin layer by using the first thermosetting resin composition layer, the curable resin composition layer can have a two layer structure. Note that in this case, the second resin layer can be used as a layer to be plated for forming the conductor layer by electroless plating or the like, and the first resin layer can be used as an adhesive layer for adhering with the substrate, for example. The second thermosetting resin composition for forming the second resin layer is not particularly limited, and usually, a composition containing a curable resin which is different from the first thermosetting resin composition and a curing gent can be used, but from the perspective of improving electrical properties and heat resistance of the curable resin composition layer, the curable resin preferably contains an alicyclic olefin polymer having a polar group.

The alicyclic olefin polymer having a polar group is not particularly limited, and examples of the alicyclic structure include cycloalkane structures, cycloalkene structures, and the like.

From the perspective of having excellent mechanical strength and heat resistance, having a cycloalkane structure is preferable. Furthermore, examples of the polar group contained in the alicyclic olefin polymer include alcoholic hydroxyl groups, phenolic hydroxyl groups, carboxyl groups, alkoxyl groups, epoxy groups, glycidyl groups, oxycarbonyl groups, carbonyl groups, amino groups, carboxylic acid anhydride groups, sulfonic acid groups, phosphoric acid groups, and the like. Of these, carboxyl groups, carboxylic acid anhydride groups, and phenolic hydroxyl groups are preferable, and carboxylic acid anhydride groups are more preferable. Furthermore, the curing agent contained in the second thermosetting resin composition is not particularly limited as long as the curing agent can form a crosslinked structure to the alicyclic olefin polymer having a polar group by heating, and a curing agent that is added to the general resin composition for forming an electrical insulating film can be used.

The curing agent is preferably a compound having two or more functional groups that can form a bond by reacting with the polar group of the alicyclic olefin polymer having a polar group that is used. For example, examples of the curing agent that is preferably used in cases using an alicyclic olefin polymer having a carboxyl group, carboxylic acid anhydride group, or phenolic hydroxyl group as the alicyclic olefin polymer having a polar group, include polyvalent epoxy compounds, polyvalent isocyanate compounds, polyvalent amine compounds, polyvalent hydrazide compounds, aziridine compounds, basic metal oxides, organometallic halides, and the like.

One type thereof may be used independently, or two or more types thereof may be used in combination. Furthermore, the compounds can be used in combination with peroxides to use as a curing agent. Of these, from the perspective of having gentle reactivity between the alicyclic olefin polymer having a polar group and the polar group thereof, the curing agent is preferably a polyvalent epoxy compound, and particularly preferably a glycidyl ether type epoxy compound or alicyclic polyvalent epoxy compound. The added amount of the curing agent in the second thermosetting resin composition is preferably within a range of 1 to 100 parts by weight, more preferably 5 to 80 parts by weight, and even more preferably 10 to 50 parts by weight with regard to 100 parts by weight of the alicyclic olefin polymer having a polar group.

By setting the added amount of the curing agent to the aforementioned range, mechanical strength and electrical properties of the cured resin layer can be favorable. Furthermore, the second thermosetting resin composition may contain hindered phenol compounds or hindered amine compounds in addition to the aforementioned components. The added amount of the hindered phenol compound in the second thermosetting resin composition is not particularly limited, but preferably within a range of 0.04 to 10 parts by weight, more preferably 0.3 to 5 parts by weight, and even more preferably 0.5 to 3 parts by weight with regard to 100 parts by weight of the alicyclic olefin polymer having a polar group.

By setting the added amount of the hindered phenol compound to the aforementioned range, mechanical strength and electrical properties of the cured resin layer can be made good. Furthermore, the hindered amine compound is a compound having in a molecule at least one 2,2,6,6-tetraalkylpiperidine group having a secondary amine or tertiary amine at position 4.

The number of carbon atoms of alkyl is usually 1 to 50. The hindered amine compound is preferably a compound having in a molecule at least one 2,2,6,6-tetramethylpiperidyl group having a secondary amine or tertiary amine at position 4.

Note that in the present invention, the hindered phenol compound and hindered amine compound is preferably used in combination, and by using in combination, in the case of performing surface roughening treatment by using an aqueous solution of permanganate or the like for the cured resin layer, even in the case where the surface roughening treatment condition is changed, a cured product with low surface roughness can be maintained after surface roughening treatment. The added amount of the hindered amine compound is not particularly limited, but is usually 0.02 to 10 parts by weight, preferably 0.2 to 5 parts by weight, and more preferably 0.25 to 3 parts by weight with regard to 100 parts by weight of the alicyclic olefin polymer having a polar group. By setting the added amount of the hindered amine compound to the aforementioned range, mechanical strength and electrical properties of the cured resin layer can be made favorable.

Furthermore, the second thermosetting resin composition may contain a curing promoting agent in addition to the aforementioned components.

A curing promoting agent added to the general resin composition for forming an electrical insulating film is preferably used as the curing promoting agent, and a curing promoting agent similar to the first thermosetting resin composition can be used, for example.

The added amount of the curing promoting agent in the second thermosetting resin composition may be appropriately selected according to the purpose of use, but is preferably 0.001 to 30 parts by weight, more preferably 0.01 to 10 parts by weight, and even more preferably 0.03 to 5 parts by weight with regard to 100 parts by weight of the alicyclic olefin polymer having a polar group. Furthermore, the second thermosetting resin composition may contain a filler in addition to the aforementioned components.

A similar filler as the filler used in the first thermosetting resin composition can be used as the filler. The added amount of the filler in the second thermosetting resin composition is usually 1 to 50 wt. %, preferably 2 to 45 wt. %, and more preferably 3 to 35 wt. % in terms of solid content.

Furthermore, in addition to the aforementioned components, curing promoting agents, flame retardants, flame retardant auxiliary agents, heat resistant stabilizers, weather resistant stabilizers, antioxidants, ultraviolet absorbers (laser processability improver), leveling agents, antistatic agents, slip agents, anti-blocking agents, anti-fogging agents, lubricants, dyes, natural oils, synthetic oils, waxes, emulsions, magnetic materials, dielectric property adjusting agents, toughening agents, and other known components may be appropriately added to the second thermosetting resin composition, similarly to the first thermosetting resin composition.

The manufacturing method of the second thermosetting resin composition is not particularly limited, and the aforementioned components may be mixed as they are, or may be mixed in a state dissolved or dispersed in an organic solvent, or a composition in a state wherein a portion of the components are dissolved or dispersed in an organic solvent may be prepared, and then the remaining components may be mixed into the composition. In the first step in the manufacturing method of the present invention, in the case of making the curable resin composition layer have a two layer structure with the first resin layer and the second resin layer, the following two methods may be used, for example. In other words, manufacturing can be performed by (1) a method of manufacturing by coating, spraying, or casting the second thermosetting resin composition onto the supporting body, drying if desired to form the second resin layer, and then further coating or casting the first thermosetting resin composition thereon, and drying if desired to form the first resin layer, or (2) a method of manufacturing by coating, spraying, or casting the second thermosetting resin composition onto the supporting body, drying if desired to obtain the second resin layer with a supporting body, and then coating, spraying, or casting the obtained second resin layer with a supporting body and the first thermosetting resin composition onto a different supporting body, drying if desired, laminating with the first resin layer with a supporting body, integrating the compacts, and then peeling the supporting body from the first resin layer side. Of these manufacturing methods, the manufacturing method (1) is preferable from the perspective of having an easier process and having excellent productivity. In the manufacturing method (1), when coating, spraying, or casting the second thermosetting resin composition onto the supporting body, or when coating, spraying, or casting the first thermosetting resin composition onto the second resin layer formed by using the second thermosetting resin composition, or in the manufacturing method (2), when obtaining the second resin layer with a supporting body and the first resin layer with a supporting body by using the second thermosetting resin composition and the first thermosetting resin composition, adding an organic solvent as desired to the second thermosetting resin composition or the first thermosetting resin composition and then coating, spraying, or casting onto the supporting body is preferable.

The thickness of the second resin layer and the first resin layer in the manufacturing methods (1), (2) is not particularly limited, but the thickness of the second resin layer is preferably 1 to 10 µm, more preferably 1.

5 to 8 µm, and even more preferably 2 to 5 µm, and furthermore, the thickness of the first resin layer is preferably 4 to 45 µm, more preferably 7 to 40 µm, and even more preferably 9 to 29 µm. If the thickness of the second resin layer is too thin, there is a risk that the formative of the conductor layer may be reduced when the second resin layer is used as a layer to be plated and the conductor layer is formed by the electroless plating.

On the other hand, if the thickness of the second resin layer is too thick, there is a risk that the linear expansion of the cured resin layer may increase.

Furthermore, if the thickness of the first resin layer is too thin, there are cases where the wiring embedding properties may be reduced. Examples of the method of coating the second thermosetting resin composition and the first thermosetting resin composition include dip coating, roller coating, curtain coating, die coating, slit coating, gravure coating, and the like. Furthermore, the drying temperature is preferably a temperature at which the second thermosetting resin composition and the first thermosetting resin composition are not cured, and is usually 20 to 300° C., and preferably 30 to 200° C. Furthermore, the drying time is usually 30 seconds to 1 hour, and preferably 1 minute to 30 minutes.

Second Step

The second step of the manufacturing method of the present invention is a step of laminating the curable resin composition with a supporting body that was obtained in the aforementioned first step onto a substrate on a curable resin composition layer forming surface side to obtain a pre-cured composite with a supporting body. The substrate is not particularly limited, and examples include: Substrates having a conductor layer on a surface thereof, or the like. The substrate having a conductor layer on the surface thereof has a conductor layer on a surface of an electrical insulating substrate, and examples of the electrical insulating substrate include products that were formed by curing a resin composition containing a known electrical insulating material (alicyclic olefin polymers, epoxy compounds, maleimide resin, (meth)acrylic resin, diallyl phthalate resin, triazine resin, polyphenylene ether, glass, and the like, for example).

Furthermore, the conductor layer is not particularly limited, but is usually a layer containing a wiring formed by a conductive body such as conductive metal or the like, and may further contain various circuits. Configuration, thickness, and the like of the wiring and circuit are not particularly limited. Specific examples of the substrate having a conductor layer on a surface thereof include printed-wiring assemblies, silicon wafer substrates, and the like. The thickness of the substrate having a conductor layer on a surface thereof is usually 10 µm to 10 mm, preferably 20 µm to 5 mm, and more preferably 30 µm to 2 mm. Note that the height (thickness) of the wiring in the substrate having a conductor layer on a surface thereof is usually 3 to 35 µm.

Furthermore, from the perspective of improving wiring embedding properties and insulation reliability when formed into a cured resin layer, the difference "thickness of the curable resin composition layer—height (thickness) of the wiring" between the thickness of the curable resin composition layer and the height (thickness) of the wiring in the substrate having a conductor layer on a surface thereof is preferably 35 µm or less, and more preferably 3 to 30 µm.

Furthermore, the substrate having a conductor layer on a surface thereof used in the present invention preferably has pretreatment performed to the conductor layer surface in order to improve adhesion with the curable resin composition layer. A known technique can be used without particular limitation as the method of pretreatment.

For example, if the conductor layer is made of copper, examples of the method include oxidation treatment methods wherein a strong alkali oxidizing solution is brought into contact with the conductor layer surface to form a copper oxide layer onto the conductor surface and then roughening is performed, methods of using sodium borohydride, formalin, and the like to perform reduction after oxidizing the conductor layer surface using the previous method, methods of precipitating a plating onto the conductor layer and then roughening, methods of bringing an organic acid into contact with the conductor layer to elute the grain boundary of the copper and then roughening, methods of forming a primer layer onto the conductor layer by a thiol compound, silane compound, or the like. Of these, from the perspective of ease of maintaining the shape of the fine wiring pattern, the method of bringing an organic acid into contact with the conductor layer to elute the grain boundary of the copper and then roughening, and the method of forming a primer layer onto the conductor layer by a thiol compound, silane compound, or the like, are preferable. In the second step of the manufacturing method of the present invention, examples of the method of laminating the curable resin composition with a supporting body onto the substrate on the curable resin composition layer forming surface side include methods of heat crimping the curable resin composition with a supporting body onto the substrate on the curable resin composition layer forming surface side, or the like.

Examples of the method of heat crimping include methods of overlaying the compact or composite compact with a supporting body so as to be in contact with the aforementioned conductor layer of the substrate, and performing heat crimping (lamination) by a pressurizer such as pressurizing laminators, presses, vacuum laminators, vacuum presses, roll laminator, and the like.

By applying heat and pressure, the conductor layer of the substrate surface and the compact or composite compact can be bonded so that a void is substantially not present at the interface thereof.

The compact or composite compact is usually laminated onto the conductor layer of the substrate in an uncured or semi-cured state. The temperature of the heat crimping operation is usually 30 to 25° C. and preferably 70 to 200° C., the pressure to be applied is usually 10 kPa to 20 MPa and preferably 100 kPa to 10 MPa, and the time is usually 30 seconds to 5 hours and preferably 1 minute to 3 hours. Furthermore, heat crimping is preferably performed under reduced pressure in order to improve embedding properties of the wiring pattern and to suppress the generation of bubbles. The pressure of the reduced pressure to perform heat crimping is usually 100 kPa to 1 Pa, and preferably 40 kPa to 10 Pa.

Third Step

The third step of the manufacturing method of the present invention is a step of performing a first heating to the pre-cured resin composition layer with a supporting body obtained in the second step, formed from the substrate and the curable resin composition layer with a supporting body, to thermally cure the curable resin composition layer to form a cured resin layer.

The heating temperature of the first heating in the third step may be appropriately set according to the curing temperature of the curable resin composition layer or the type of the supporting body, but is preferably 100 to 250° C., preferably 120 to 220° C., and more preferably 150 to 210° C.

Furthermore, the heating time of the first heating in the third step is usually 0.1 to 3 hours and preferably 0.25 to 1.5 hours. The method of heating is not particularly limited, and may be performed by using an electric oven or the like, for example. Furthermore, the thermal curing is preferably performed in an atmosphere from the perspective of productivity.

Fourth Step

The fourth step of the manufacturing method of the present invention is a step of performing hole punching from the supporting body side of the cured composite with a supporting body obtained in the third step to form a via hole in the cured resin layer. In the fourth step, the method for forming the via hole is not particularly limited, but the via hole can be formed by performing hole punching by a physical process using drills, lasers, plasma etching, and the like, from the supporting body side.

Of these methods, a method using a laser (carbon dioxide gas laser, excimer laser, UV-YAG laser, and the like), in other words, a method of irradiating a laser from the supporting body side to form a via hole is preferable because a finer via hole can be formed without impairing the characteristics of the cured resin layer.

In the manufacturing method of the present invention, by forming a via hole in the cured resin layer by performing hole punching from the supporting body side, a via hole with a small diameter (the top diameter is preferably 15 to 65 μm and more preferably 15 to 55 μm, for example) can be formed with a high aperture ratio (bottom diameter/top diameter).

Fifth Step

The fifth step of the manufacturing method of the present invention is a step of peeling the supporting body from the cured composite with a supporting body to obtain the cured composite formed from the substrate and the cured resin layer. The method of peeling the supporting body is not particularly limited.

Sixth Step

The sixth step of the manufacturing method of the present invention is a step of removing the resin residue in the via hole of the cured composite after peeling the supporting body. The method of removing the resin residue in the via hole is not particularly limited, but examples include methods of performing a desmear treatment or the like to the cured composite after peeling the supporting body.

The method of the desmear treatment is not particularly limited, and examples include a method of bringing a solution of an oxidizing compound (desmear liquid) such as a permanganate or the like into contact, for example. Specifically, the desmear treatment can be performed by performing rocking immersion of the laminated body in which a via hole is formed for 1 to 50 minutes in an aqueous solution at 60 to 80° C. adjusted to have a sodium permanganate concentration of 60 g/L and sodium hydroxide concentration of 28 g/L. Note that in the manufacturing method of the present invention, a surface roughening treatment to roughen the surface of the cured resin layer may be performed before or after the desmear treatment for removing the resin residue in the via hole. The surface roughening treatment is performed in order to enhance the adhesion between the cured resin layer and the conductor layer. The surface roughening treatment is not particularly limited, and examples include methods of bringing the cured resin layer surface into contact with the oxidizing compound, or the like.

Examples of the oxidizing compound include known compounds having oxidizing ability, such as inorganic oxidizing compounds and organic oxidizing compounds.

Using inorganic oxidizing compounds or organic oxidizing compounds are particularly preferable because of the ease of controlling the average surface roughness of the cured resin layer.

Examples of the inorganic oxidizing compound include permanganates, chromic anhydrides, dichromates, chromates, persulfates, activated manganese dioxide, osmium tetroxide, hydrogen peroxide, periodate salts, and the like.

Examples of the organic oxidizing compound include dicumyl peroxides, octanoyl peroxides, m-chloroperbenzoic acids, peracetic acids, ozones, and the like. Furthermore, the manufacturing method of the present invention can have a configuration wherein the surface roughening treatment of the cured resin layer is performed simultaneously with the desmear treatment for removing the resin residue in the via hole.

Seventh Step

The seventh step of the manufacturing method of the present invention is a step of performing a second heating on the cured composite of which removal of the resin residue in the via hole was performed. In the manufacturing method of the present invention, the curable resin composition layer is thermally cured to form a cured resin layer, a via hole is formed in the cured resin layer, the supporting body is peeled from the cured resin layer, the resin residue in the via hole is removed, and then the second heating is further performed, to sufficiently advance the curing of the cured resin layer and appropriately remove volatile components (organic solvent or the like used for preparing the first thermosetting resin composition or the second thermosetting resin composition, for example) or the like, and thereby improve the heat resistance (solder heat resistance, for example) of the cured resin layer. Particularly, if thermal curing is performed in a state where the supporting body is not peeled and the supporting body is attached, the volatile components or the like may not be appropriately removed due to the influence of the supporting body (particularly, the volatile components or the like in the region in the vicinity of the supporting body may not be removed), and due to the influence of the volatile components, the obtained cured resin layer may have insufficient heat resistance. In contrast, in the manufacturing method of the present invention, while thermal curing (first heating) is performed in a state where the supporting body is not peeled and the supporting body is still attached, by performing the second heating again after peeling the supporting body, the volatile components or the like that could not be removed during the first heating due to the influence of the supporting body can be appropriately removed, and thereby heat resistance can be sufficiently improved. The heating temperature of the second heating in the seventh step is not particularly limited, but from the perspective of improving the adhesion between the cured resin layer after heating and the conductor layer formed on the cured resin layer, the temperature is preferably a temperature that is lower than the heating temperature of the first heating in the third step, more preferably a temperature that is lower than the heating temperature of the first heating by 10° C. or more, and even more preferably a temperature that is lower than the heating temperature of the first heating by 30° C. or more.

Furthermore, the heating temperature of the second heating may be set in relation to the boiling temperature of the organic solvent used for preparing the first thermosetting resin composition or the second thermosetting resin composition, and is preferably a temperature that is 5° C. or higher than the boiling point of the organic solvent that is used, and more preferably a temperature that is 10° C. or higher than the boiling point of the organic solvent that is used. Specifically, the heating temperature of the second heating is preferably within a range of 130 to 170° C., and more preferably within a range of 140 to 160° C. If the heating temperature of the second heating is too low, the improving effect of the heat resistance of the cured resin layer may be difficult to obtain, and on the other hand, if the heating temperature of the second heating is too high, the wettability of the cured resin layer may be reduced, and thereby the adhesion between the cured resin layer and the conductor layer formed on the cured resin layer may be reduced. Note that the heating time of the second heating in the seventh step is usually 0.1 to 3 hours, and preferably 0.25 to 1.5 hours.

Furthermore, the thermal curing is preferably performed in air, from the perspective of productivity.

Eighth Step

The eighth step of the manufacturing method of the present invention is a step of forming a conductor layer on the cured resin layer and the inner wall surface of the via hole of the cured composite which second heating was performed in the seventh step. The method of forming the conductor layer is not particularly limited, but from the perspective of forming a conductor layer with excellent adhesion at a high production efficiency, forming is preferably performed by an electroless plating method or a combination of an electroless plating and an electrolytic plating. For example, when forming the conductor layer by the electroless plating method, first, before forming a metal thin film on the inner wall surface of the via hole and a surface of the electrical insulating layer, a catalyst nucleus such as silver, palladium, zinc, cobalt or the like is generally attached onto the inner wall surface of the via hole and the surface of the electrical insulating layer.

The method of attaching the catalyst nucleus to the inner wall surface electrical insulating layer of the via hole is not particularly limited, and examples include methods of immersing into a solution in which a metal compound such as silver, palladium, zinc, cobalt, and the like, or salts or complexes thereof, for example, are dissolved into an organic solvent such as water, alcohol, or chloroform at a concentration of 0.001 to 10 wt. % (may contain acid, alkali, complexing agent, reducing gent, and the like as necessary) to reduce the metal, and the like. The electroless plating solution used in the electroless plating method can be a known autocatalytic electroless plating solution, and the type of metal, type of reducing agent, type of complexing agent, hydrogen ion concentration, dissolved oxygen concentration, and the like that are contained in the plating solution are not particularly limited.

For example, electroless copper plating solutions with a reducing agent of ammonium hypoisonate, hypophosphorous acid, ammonium borohydride, hydrazine, formalin, and the like; electroless nickel platinum plating solutions with a reducing agent of sodium hypoisonate; electroless nickel-boron plating solutions with a reducing agent of dimethylamine borane; electroless palladium plating solutions; electroless palladium-phosphorus plating solutions with a reducing agent of sodium hypophosphite; electroless gold plating solutions; electroless silver plating solutions; electroless nickel-cobalt-phosphorus plating solutions with a reducing agent of sodium hypoisonate; and other electroless plating solutions can be used. After the metal thin film is formed, the substrate surface can be brought into contact with an antirust agent to perform antirust treatment. Furthermore, after the metal thin film is formed, the metal thin film may be heated to improve adhesion or the like. The heating temperature is usually 50 to 350° C., and preferably 80 to 250° C. Note that the heating can be performed under pressurized conditions. Examples of the pressurizing method include using physical pressurizing means by hot press machines, pressurized heating rolls, and the like. The pressure applied is usually 0.1 to 20 MPa, and preferably 0.5 to 10 MPa.

High adhesion between the metal thin film and the electrical insulating layer can be secured within these ranges. Furthermore, growing the plating by further performing electroless plating on the metal thin film that was formed by the electroless plating method is preferable. Thereby, the conductor can be filled into the via hole by the electroless plating and the electrolytic plating, and thick plating can be performed on the cured resin layer. When performing thick plating onto the cured resin layer by electrolytic plating, a resist pattern for plating is formed on the metal thin film that was formed by the electroless plating method to grow the plating, and then removing the resist and further etching the metal thin film into a pattern by etching to form a conductor layer is preferable.

The conductor layer formed by the method is usually formed from the patterned metal thin film and the plating grown on the metal thin film.

The laminated body thus obtained by the manufacturing method of the present invention is obtained by the aforementioned first step to eighth step, and therefore, a small diameter via hole with excellent heat resistance (solder heat resistance, for example) and excellent conduction reliability can be formed therein, and therefore, the laminated body can be preferably used as a multilayer circuit board by taking advantage of these characteristics.

Furthermore, by using the laminated body thus obtained by the manufacturing method of the present invention as a substrate used in the second step of the manufacturing method of the present invention and by repeatedly performing the third step to eighth step, further multilayering can be performed to thereby form a desired multilayer circuit board.

EXAMPLES

The present invention is described in further detail by the examples and comparative examples below. Note that "parts" and "%" in the examples are on a weight basis unless otherwise specified.

Various physical properties were evaluated according to the method below.

(1) Small Diameter Via Hole Formative

The via hole was formed, desmear treatment and second heating was performed on the cured composite, and then the via hole after the desmear treatment was observed with an electron microscope (magnification: 1000 times) to measure the opening size of the via hole, and then the small diameter via hole formative was evaluated according to the criteria below.

A: Opening size of the via hole is less than 55 μm
B: Opening size of the via hole is 55 μm or more and 65 μm or less
C: Opening size of the via hole exceeds 65 μm (2) Desmearity The via hole was formed, desmear treatment and second heating was performed on the cured composite, and then the via hole after the desmear treatment was observed with an electron microscope (magnification: 5000 times) to observe the resin residue (smear) in the via hole, and then evaluation was performed according to the criteria below.

A: Existence area of the smear in the via hole is less than 3% of the measurement area.
B: Existence area of the smear in the via hole is 3% or more and less than 10% of the measurement area.

C: Existence area of the smear in the via hole is 10% or more of the measurement area.

(3) Solder Heat Resistance

The obtained multilayer printed wiring board was allowed to float on a solder bath at 260° C. for 60 seconds, the multilayer printed wiring board after floating was externally observed, and then evaluation was performed according to the criteria below.

Evaluation Criteria
A: No swelling was observed.
C: Swelling was observed in 1 area or more.

(4) Adhesion Between the Cured Resin Layer and the Conductor Layer (Peeling Strength)

For the obtained multilayer printed wiring board, the peeling strength between the cured resin layer (electrical insulating layer) and the conductor layer was measured in accordance with JIS C6481-1996, and then evaluation was performed according to the criteria below.

A: Peeling strength is 5 N/cm or more
B: Peeling strength is 4 N/cm or more and less than 5 N/cm
C: Less than 4 N/cm Synthesis Example 1

As a first stage of polymerization, 35 molar parts of 5-ethylidene-bicyclo [2.2.1]hepta-2-en, 0.9 molar parts of l-hexene, 340 molar parts of anisole, and 0.005 molar parts of ruthenium 4-acetoxybenzylidene (dichloro) (4,5-dibromo-1,3-dimesityl-4-imidazolin-2-ylidene) (tricyclohexylphosphine) (C1063, manufactured by Wako Pure Chemical Industries) were incorporated in a nitrogen substituted pressure resistant glass reactor, and polymerization reaction was performed by stirring at 80° C. for 30 minutes to obtain a solution of a norbornene-based ring-opening polymer.

Next, as a second stage of polymerization, 45 molar parts of tetracyclo [6.5.0.12,5.08,13]trideca-3,8,10,12-tetraene, 20 molar parts of bicyclo [2.2.1] hept-2-ene-5,6-dicarboxylic anhydride, 250 molar parts of anisole, and 0.01 molar parts of C1063 were added to the solution obtained in the first stage of polymerization, and polymerization reaction was performed by stirring at 80° C. for 1.5 hours to obtain a solution of a norbornene-based ring-opening polymer. For the solution, gas chromatography was measured, and it was confirmed that no monomers were substantially remaining, and the polymerization conversion rate was 99% or higher.

Next, the solution of the obtained ring-opening polymer was added to a nitrogen substituted autoclave with mixer, 0.03 molar parts of C1063 were added, and a hydrogenation reaction was performed by stirring at 150° C. at a hydrogen pressure of 7 MPa for 5 hours to obtain a solution of an alicyclic olefin polymer (1) which is a hydrogation adduct of the norbornene-based ring-opening polymer. The weight average molecular weight of the alicyclic olefin polymer (1) was 60,000, the number average molecular weight was 30,000, and the molecular weight distribution was 2. Furthermore, the hydrogenation ratio was 95%, and the content rate of the repeating unit having a carboxylic anhydride group was 20 mol %.

The solid content concentration of the solution of the alicyclic olefin polymer (1) was 22%.

Example 1

Preparation of the First Thermosetting Resin Composition
50 parts of a biphenyldimethylene skeleton novolak epoxy resin as the polyvalent epoxy compound (A) having a biphenyl structure (trade name "NC-3000L", manufactured by Nippon Kayaku Co., Ltd., epoxy equivalent of 269), 50 parts of tetrakis hydroxyphenylethane type epoxy compound as the epoxy group (B) containing a trivalent or higher polyvalent glycidyl group (trade name "jER1031S", manufactured by Mitsubishi Chemical Corporation, epoxy equivalent of 200, softening point of 90° C.), 30 parts (15 parts in terms of cresol novolac resin containing a triazine structure) of cresol novolak resin containing a triazine structure as the phenol resin (C) containing a triazine structure (trade name "phenolite LA-3018-50P", propylene glycol monomethyl ether solution with a nonvolatile content of 50%, manufactured by DIC Corporation, active hydroxyl group equivalent of 154), 115.3 parts (75 parts in terms of active ester compounds) of active ester compound as the active ester compound (D) (trade name "Epiclon HPC-8000-65T", toluene solution having a nonvolatile content of 65%, manufactured by DIC Corporation, active ester group equivalent of 223), 350 parts of silica as a filler (trade name "SC2500-SXJ", manufactured by Admatechs), 1 part of hindered phenol antioxidant as an anti-aging agent (trade name "Irganox (registered trademark) 3114", manufactured by BASF), and 110 parts of anisole (boiling point of 154° C.) were mixed and stirred with a planetary stirrer for 3 minutes. In addition, 8.3 parts (2.5 parts in terms of 1-benzyl-2-phenylimidazole) of a solution in which 1-benzyl-2-phenylimidazole was 30% dissolved in anisole were mixed therein as the curing promoting agent, and stirred for with a planetary stirrer for 5 minutes to obtain a varnish of the first thermosetting resin composition. Note that the amount of filler in the varnish was 64% in terms of solid content.

The Second Thermosetting Resin Composition 454 parts of the solution of the alicyclic olefin polymer (1) obtained in Synthesis Example (100 parts in terms of alicyclic olefin polymer (1)), 36 parts of the polyvalent epoxy compound having a dicyclopentadiene skeleton as a curing agent (trade name "Epiclon HP7200L", manufactured by DIC Corporation, "Epiclon" is a registered trademark), 24.5 parts of silica as an inorganic filler (trade name "Admafine SO-C1", manufactured by Admatechs, average particle size of 0.25 μm, "Admafine" is a registered trademark), 1 part of tris (3,5-di-t-butyl-4-hydroxybenzyl)-isocyanurate as an anti-aging agent (trade name "Irganox (registered trademark) 3114", manufactured by BASF), 0.5 parts of 2-[2-hydroxy-3,5-bis (α, α-dimethylbenzyl) phenyl]-2H-benzotriazole as an ultraviolet absorber, and 0.5 parts of 1-benzyl-2-phenylimidazole as a curing promoting agent were mixed with anisole, and by mixing so that the compounding agent concentration was 16%, a varnish of the second thermosetting resin composition was obtained.

Preparation of the Cured Composite

The varnish of the second thermosetting resin composition that was obtained was applied onto a polyethylene terephthalate film (supporting body, thickness of 50 μm) having a release layer on a surface thereof using a wire bar, and then in a nitrogen atmosphere, dried at 80° C. for 5 minutes to obtain a film with a supporting body formed from an uncured second thermosetting resin composition, on which a second resin layer (plated layer) with a thickness of 3 μm is formed.

Next, the varnish of the first thermosetting resin composition that was obtained was applied onto the formed surface of the second resin layer formed from the second thermosetting resin composition of the film with a supporting body, using a doctor blade (manufactured by Tester Sangyo Co., Ltd.) and an autofilm applicator (manufactured by Tester Sangyo Co., Ltd.), and then drying was performed in a nitrogen atmosphere at 80° C. for 5 minutes to obtain a curable resin composition layer with a supporting body, which the second resin layer and the first resin layer (adhesive layer) with a total thickness of 30 μm is formed thereon. The curable resin composition layer with a supporting body was formed in the order of the supporting body, the second resin layer formed from the second thermosetting resin composition, and then the first resin layer formed from the first thermosetting resin composition.

Next, separately from the above, on a surface of a core material obtained by impregnating a varnish containing a glass filler and an epoxy compound not containing a halogen into a glass fiber, a conductor layer with a wiring width and distance between the wires of 50 μm, with a thickness of 18 μm, and that was treated with microetching by bringing a surface thereof into contact with an organic acid, was formed onto a double-sided copper clad substrate surface with a thickness of 0.8 mm, 160 mm square (length of 160 mm, width of 160 mm) attached with copper with a thickness of 18 μm, to obtain an inner layer substrate.

On both surfaces of the inner layer substrate, the obtained curable resin composition layer with a supporting body cut into 150 mm squares with the supporting body attached, were attached together so that the surface of the curable resin composition layer was on the inside, and then a vacuum laminator with a heat resistant rubber press plate on the top and bottom thereof was used to reduce the pressure to 200 Pa and perform heat crimping lamination at a temperature of 110° C. and a pressure of 0.1 MPa for 60 seconds. Next, after left to stand at room temperature for 30 minutes, by heating (the first heating) at 180° C. for 30 minutes and curing the curable resin composition layer, a cured resin layer (electrical insulating layer) was formed.

Next, for the cured resin layer formed on both surfaces of the inner substrate, a carbon dioxide gas laser processor (product name "LUC-2K21", manufactured by Hitachi Via Mechanics, Ltd.) was used, with the supporting body still attached, and by irradiating the carbon dioxide gas laser from the supporting body side at a pulse width of 6 μs, a frequency of 2000 Hz, and performing 2 shots, a via hole with an opening size of 49 μm was formed in the cured resin layer. Then, the supporting body was peeled from the cured resin layer where the via hole was formed.

Desmear Treatment Step

Rocking immersion of the obtained cured composite was performed for 15 minutes in an aqueous solution at 60° C. which was prepared so that a swelling liquid ("Swelling Dip SECURIGANT P", manufactured by Adtec Corporation, "SECURIGANT" is a registered trademark) was 500 mL/L and sodium hydroxide was 3 g/L, and then the cured composite was washed with water.

Next, rocking immersion was performed for 15 minutes in an aqueous solution at 80° C. which was prepared so that an aqueous solution of permanganate ("Concentrate compact CP", manufactured by Adtec Corporation) was 640 mL/L and sodium hydroxide concentration was 40 g/L, and then washing with water was performed.

Next, the cured composite was immersed for 5 minutes in an aqueous solution at 40 C which was prepared so that a hydroxylamine sulfate aqueous solution ("Reduction SECURIGANT P500", manufactured by Adtec Corporation, "SECURIGANT" is a registered trademark) was 100 mL/L and sulfuric acid was 35 mL/L, neutralization reduction treatment was performed, and then washing with water was performed.

Second Heating Step

Next, the cured composite after desmear treatment was heated at 200° C. for 30 minutes (second heating). Then the cured composite obtained by the desmear treatment and the second heating was evaluated for small diameter via hole formative and desmearity according to the aforementioned method. The results are shown in Table 1.

Cleaner/Conditioner Step

Next, the cured composite after the second heating treatment was immersed for 5 minutes in an aqueous solution at 50° C. which was prepared so that a cleaner/conditioner aqueous solution ("Alcup MCC-6-A", manufactured by Uyemura & Co., Ltd., "Alcup" is a registered trademark) had a concentration of 50 mL/L, and then a cleaner/conditioner treatment was performed. Next, the cured composite was immersed for 1 minute in an aqueous solution at 40° C., and then washed with water.

Soft Etching Treatment Step

Next, the cured composite was immersed for 2 minutes in an aqueous solution which was prepared so that a sulfuric acid concentration was 100 g/L and sodium persulfate was 100 g/L, soft etching treatment was performed, and then washed with water.

Acid Pickling Treatment Step

Next, the cured composite was immersed for 1 minute in an aqueous solution which was prepared so that a sulfuric acid concentration was 100 g/L, acid pickling was performed, and then washed with water.

Catalyst Provision Step

Next, the cured composite was immersed for 5 minutes in a plating catalyst aqueous solution containing Pd salt at 60° C. which was prepared so that an Alcup activator MAT-1-A (trade name, manufactured by Uyemura & Co., Ltd., "Alcup" is a registered trademark) was 200 mL/L, Alcup activator MAT-1-B (trade name, manufactured by Uyemura & Co., Ltd., "Alcup" is a registered trademark) was 30 mL/L, and sodium hydroxide was 0.35 g/L, and then washed with water.

Activation Step

Next, the cured composite was immersed at 35° C. for 3 minutes in an aqueous solution which was prepared so that an Alcup reducer MAB-4-A (trade name, manufactured by Uyemura & Co., Ltd., "Alcup" is a registered trademark) was 20 mL/L and an Alcup reducer MAB-4-B (trade name, manufactured by Uyemura & Co., Ltd., "Alcup" is a registered trademark) was 20 mL/L, reducing treatment was performed on the plating catalyst, and then washed with water.

Accelerator Processing Step

Next, the cured composite was immersed for 1 minute at 25° C. in an aqueous solution prepared so that an Alcup accelerator MEL-3-A (trade name, manufactured by Uyemura & Co., Ltd., "Alcup" is a registered trademark) was 50 mL/L.

Electroless Plating Step

The cured composite thus obtained was immersed at a temperature of 36° C. for 20 minutes in an electroless copper plating solution while blowing air therein, which was prepared so that Thru-cup PEA-6-A (trade name, manufactured by Uyemura & Co., Ltd., "Thru-cup" is a registered trademark) was 100 mL/L, Thru-cup PEA-6-B-2X (trade name, manufactured by Uyemura & Co., Ltd.) was 50 mL/L, Thru-cup PEA-6-C (trade name, manufactured by Uyemura & Co., Ltd.,) was 14 mL/L, Thru-cup PEA-6-D (trade name, manufactured by Uyemura & Co., Ltd.) was 15 mL/L, Thru-cup PEA-6-E (trade name, manufactured by Uyemura & Co., Ltd.) was 50 mL/L, and 37% formalin aqueous solution was 5 mL/L to perform electroless copper plating treatment and form a metal thin film on the via hole inner wall surface of the cured composite and the cured resin layer surface (surface of the second resin layer after curing, formed from the second thermosetting resin composition).

Next, the cured composite formed with the metal thin film was immersed for 1 minute at room temperature in an antirust solution that was prepared so that an AT-21 (trade name, manufactured by Uyemura & Co., Ltd.) was 10 mL/L, washed with water, and then dried to prepare an antirust treated cured composite. The cured composite that was subjected to the antirust treatment was subjected to annealing treatment at 150° C. for 30 minutes in an air atmosphere.

The cured composite that was subjected to annealing treatment was subjected to electrolytic copper plating to form an electrolytic copper plating film with a thickness of 30 μm. Next, by performing heat treatment at 180° C. for 60 minutes on the cured composition, the conductor formed from the metal thin film layer and the electrolytic copper plating in the via hole of the cured composite was filled, and a two-sided two-layer multilayer printed wiring board, formed with a conductor layer formed from the metal thin film layer and the electrolytic copper plating film on the cured resin layer (electrical insulating layer) of the cured composite. Then, the obtained multilayer printed wiring board was used to evaluate the solder heat resistance and adhesion (peeling strength) between the cured resin layer and the conductor layer. The results are shown in Table 1.

Example 2

Other than changing the heating temperature from 200° C. to 160° C. in the second heating step, the same conditions were applied as 1 to obtain a cured composite and a multilayer printed wiring board, and evaluation was performed in the same way. The results are shown in Table 1.

Comparative Example 1

Other than not performing heating by the second heating step, the same conditions were applied as Example 1 to obtain a cured composite and a multilayer printed wiring board, and evaluation was performed in the same way. The results are shown in Table 1.

Comparative Example 2

A cured composite body and a multilayer printed circuit board were obtained in a manner similar to Example 1 and similarly evaluated, except that a curable resin composition layer with supporting body was overlaid on both surfaces of an inner layer substrate, the supporting body was peeled off, the first heating and via hole formation were performed in a condition where the supporting body was peeled off, and the heating temperature in the second heating step was changed from 200° C. to 160° C. The results are shown in Table 1.

TABLE 1

|  | Example 1 | Example 2 | Comparative Example 1 | Comparative Example 2 |
|---|---|---|---|---|
| Manufacturing condition | | | | |
| First heating temperature (° C.) | 180 | 180 | 180 | 180 |
| Forming the via hole | Forming with the supporting body | Forming with the supporting body | Forming with the supporting body | Forming after peeling the supporting body Forming |
| Second heating temperature (° C.) | 200 | 160 | No second heating | 160 |
| Evaluation | | | | |
| Small diameter via hole formative | A | A | A | C |
| Desmearity | A | A | A | A |
| Solder heat resistance | A | A | C | A |
| Peeling strength | B | A | A | A |

As shown in Table 1, with the manufacturing method of the present invention, the resin residue could be appropriately removed (excellent desmearability), and therefore the conductivity reliability was excellent, small radius via holes could be formed, and a laminate body with excellent solder heat resistance could be achieved (Working examples 1, 2).

On the other hand, when the second heating was not performed (heating after forming the deal holds, peeling the supporting body, and removing the resin residue in the via hole), the results showed inferior solder heat resistance (Comparative example 1).

Furthermore, when the first heating and via hole formation were performed while the supporting body is peeled off, a small radius via hole could not be formed (Comparative example 2).

What is claimed is:

1. A manufacturing method of a laminate body, comprising:
   a first step of forming onto a supporting body a curable resin composition layer formed from a thermosetting resin composition to obtain a curable resin composition layer with a supporting body;
   a second step of laminating the curable resin composition layer onto a substrate by heat crimping, the curable resin composition layer contacting the substrate, to thereby obtain a pre-cured composite;
   a third step of performing a first heating of the aforementioned pre-cured composite thereby thermally curing the curable resin composition layer to form a cured resin layer to obtain a cured composite;
   a fourth step of performing hole punching from the supporting body side of the cured composite to form a via hole in the cured resin layer;
   a fifth step of peeling the supporting body from the cured composite;
   a sixth step of removing resin residue in the via hole of the aforementioned cured composite;
   a seventh step of performing a second heating of the aforementioned cured composite; and
   an eighth step of forming a conductor layer on an inner wall surface of the via hole of the cured composite and on the cured resin layer.

2. The manufacturing method of a laminate body according to claim 1, wherein the heating temperature of the aforementioned second heating in the seventh step is lower than the heating temperature of the aforementioned first heating in the third step.

3. The manufacturing method of a laminate body according to claim 1, wherein forming the conductor layer in the aforementioned step is performed by electroless plating or a combination of electroless plating and electrolytic plating.

4. The manufacturing method of a laminate body according to claim 3, wherein forming the conductor layer with regard to the aforementioned via hole in the aforementioned eighth step is performed by filling a conductor into the via hole by electroless plating or a combination of electroless plating and electrolytic plating.

5. The method of claim 1, further comprising drying the curable resin composition layer at 30° C. to 200° C. prior to the third step.

6. The method of claim 5, further comprising providing a mold release layer over the supporting body prior to forming the curable resin composition layer.

7. The method of claim 5, further comprising performing a mold release treatment on the supporting body prior to forming the curable resin composition layer.

8. The method of claim 7, wherein the thermosetting resin composition comprises a novolac epoxy compound having a biphenyl structure and/or a condensed polycyclic structure.

9. The method of claim 7, wherein the curable resin composition layer comprises a first layer of a first resin composition and a second resin layer of a second composition different from the first composition.

10. The method of claim 7, wherein laminating comprises heat crimping at reduced pressure conditions of from 40 kPa to 10 Pa.

11. The method of claim 10, wherein the applied pressure is from 100 kPa to 10 MPa.

12. The method of claim 7, wherein hole punching comprises irradiating a laser from the supporting body side.

13. The method of claim 12, further comprising surface roughening treatment prior to forming a conductor layer on an inner wall surface of the via hole.

14. The method of claim 13, further comprising forming a catalyst nucleus onto the inner wall surface prior to forming the conductor layer on the inner wall surface of the via hole.

* * * * *